(12) United States Patent
Huang et al.

(10) Patent No.: US 7,411,767 B2
(45) Date of Patent: Aug. 12, 2008

(54) MULTI-DOMAIN ESD PROTECTION CIRCUIT STRUCTURE

(75) Inventors: Shao-Chang Huang, Hsin-Chu (TW); Chi-Di An, Hsin-Chu (TW); Ming-Hsiang Song, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 544 days.

(21) Appl. No.: 10/859,332

(22) Filed: Jun. 2, 2004

(65) Prior Publication Data

US 2005/0270712 A1 Dec. 8, 2005

(51) Int. Cl.
 *H02H 9/00* (2006.01)
(52) U.S. Cl. ........................................ 361/56
(58) Field of Classification Search ............ 361/90, 361/56
 See application file for complete search history.

(56) References Cited

U.S. PATENT DOCUMENTS

| | | | | |
|---|---|---|---|---|
| 5,468,984 A | * | 11/1995 | Efland et al. | 257/356 |
| 5,703,747 A | * | 12/1997 | Voldman et al. | 361/111 |
| 5,991,135 A | * | 11/1999 | Saleh | 361/56 |
| 6,011,681 A | * | 1/2000 | Ker et al. | 361/111 |
| 6,078,068 A | * | 6/2000 | Tamura | 257/203 |
| 6,144,542 A | | 11/2000 | Ker et al. | |
| 6,521,951 B2 | * | 2/2003 | Sato et al. | 257/355 |
| 6,624,998 B2 | * | 9/2003 | May et al. | 361/111 |
| 6,867,461 B1 | * | 3/2005 | Ker et al. | 257/360 |
| 2002/0084490 A1 | * | 7/2002 | Ker et al. | 257/355 |

\* cited by examiner

*Primary Examiner*—Michael Sherry
*Assistant Examiner*—Scott Bauer
(74) *Attorney, Agent, or Firm*—Slater & Matsil, L.L.P.

(57) ABSTRACT

A multi-domain ESD protection circuit structure is described. The preferred embodiment of the present invention selects power lines of an internal circuit as ESD buses. The power lines of the remaining internal circuits are coupled with the ESD buses through the ESD connection cells. In another embodiment of the preferred invention, the VDD power line from one internal circuit and the VSS power line from another circuit are selected as ESD buses. In yet another embodiment, either a VDD power line or a VSS power line of an internal circuit is selected as an ESD bus.

26 Claims, 7 Drawing Sheets

MULTI-DOMAIN ESD PROTECTION CIRCUIT STRUCTURE

FIELD OF INVENTION

This invention relates generally to an ESD protection circuit and more particularly to ESD buses used by power domains.

BACKGROUND

It is well known that extremely high voltages can develop in the vicinity of an integrated circuit due to the build-up of static charge. A high potential may be generated to an input or output buffer of an integrated circuit, which may occur by a person simply touching a package pin, which is in electrical contact with an input or output buffer of the integrated circuit. When the electrostatic is discharged, a high current is produced at the package nodes of the integrated circuit. Electro-Static Discharge (ESD) is a serious problem for semiconductor devices since it has the potential to destroy the entire integrated circuit.

The duration of the ESD transient is very short, typically in the order of nanoseconds, so that the conventional circuit breakers do not react quickly enough to provide adequate protection. For this reason, it is rapidly becoming a known practice to incorporate an ESD protection system in the circuitry itself. Conventionally, bi-directional diode strings are coupled between the nodes to protect the circuit. Other ESD devices such as transistors are also being used. ESD devices are also widely used between power lines to protect the internal circuit coupled between power lines and to discharge the ESD current to the ground.

For the purpose of decoupling noise, power lines in the integrated circuit are separated so that the noise generated in one part of the circuit does not affect another part of the circuit. However, the separation of the power lines creates more power lines that are subject to ESD. Therefore, more power line ESD protection schemes were developed.

FIG. 1 illustrates a conventional power domain ESD protection circuit. VDD power line 2 and VSS power line 6 form one power domain and VDD power line 4 and VSS power line 8 form another power domain. Internal circuit 10 is coupled between power lines 2 and 6 and internal circuit 12 is coupled between power lines 4 and 8. Bi-directional diode string 24 is used to protect circuit 10, and bi-directional diode string 30 is used to protect circuit 12. Since ESD may occur between power lines of different power domains, such as power lines 2 and 4, 6 and 8, ESD protection circuits are also required between power domains. As shown in FIG. 1, bi-directional diode string 14 is coupled between power lines 2 and 4, and a bi-directional diode string 18 is coupled between power lines 6 and 8. If a voltage transient occurs between power lines 2 and 4, the diode string 14 conducts in one direction and provides a path for electrostatic charges. Similarly, the diode string 18 between power lines 6 and 8 helps to eliminate the voltage transient between these two power lines.

When more power domains are used in the integrated circuit, every two adjacent power lines should be protected by an ESD protection circuit, therefore, the number of protection circuits increases dramatically. A more effective protection scheme, which was taken from U.S. Pat. No. 6,144,542, is devised by using ESD buses, as shown in FIG. 2. ESD buses 102, 108 and 112 formed of highly conductive materials are added into the circuit. Each VDD power line is connected to an ESD bus through an ESD connection cell wherein the ESD connection cells 11, 21, 31, . . . k1 are normally bi-directional diode strings or devices made of silicon-controlled rectifiers (SCR). VSS power lines are connected to an ESD bus 102 through ESD connection cells 12, 22, 32, . . . k2. The ESD buses are coupled with ESD clamp devices 100, 104 and 106, wherein the ESD clamp devices can be made of bi-directional diode strings or SCRs.

Comparing to the prior art in FIG. 1, instead of being coupled to each adjacent power line through an ESD protection device, a power line only connects to one ESD bus through an ESD connection cell. This greatly reduces the number of ESD protection devices required. In an example with a typical scenario, a transient occurs at one node in internal circuit i and a grounded node is at a node in another internal circuit j, where i and j are circuit numbers. The ESD current needs to go through at most two ESD connection cells, one connecting circuit i and the ESD bus and one connecting circuit j and the ESD bus. The ESD current also goes through at most one ESD clamp device in order to be conducted from one ESD bus to another.

SUMMARY OF THE INVENTION

The preferred embodiment of the present invention is devised to provide a multi-domain ESD protection circuit structure. The present invention uses an existing internal circuit's power lines as ESD buses. The ESD protection performance is improved since the ESD current flows through fewer ESD protection devices. The layout area is saved since no additional ESD buses are needed.

The preferred embodiment selects both of the VDD and VSS power lines of one internal circuit as the ESD buses. The power lines of the other internal circuits are coupled to the ESD buses through ESD connection cells. In another embodiment of the present invention, either the VDD power line or the VSS power line of an internal circuit is selected as the ESD bus. In yet another variation of the preferred embodiment, the VDD power line of one internal circuit and the VSS power line of another internal circuit are used as ESD buses. All unused power lines are coupled to the ESD buses through the ESD clamp devices.

Embodiments of the present invention can be used in circuits with divided main power domains wherein the main power domains are separated by the ESD clamp devices and the internal circuits within a main power domain are protected by the embodiments of the present invention.

DESCRIPTION OF DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiment of the multi-domain ESD protection circuit will be described. Various aspects of the present invention will be presented. An application of the present invention will then be explained.

For the convenience of the description, multiple internal circuits are used. Each internal circuit is denoted by a number and the elements of the internal circuits are denoted by like numbers prefixed by the internal circuit number. For example, the VDD power line is represented by 4, so that the VDD power line of the internal circuit 1 is 14, the VDD power line of the internal circuit 2 is 24, and the VDD power line of the internal circuit k is k4, etc. Each power line selected as an ESD bus may be denoted by two numbers. One number is derived since the power line is one element of the internal circuit. The other number is the ESD bus number.

Figure 3:
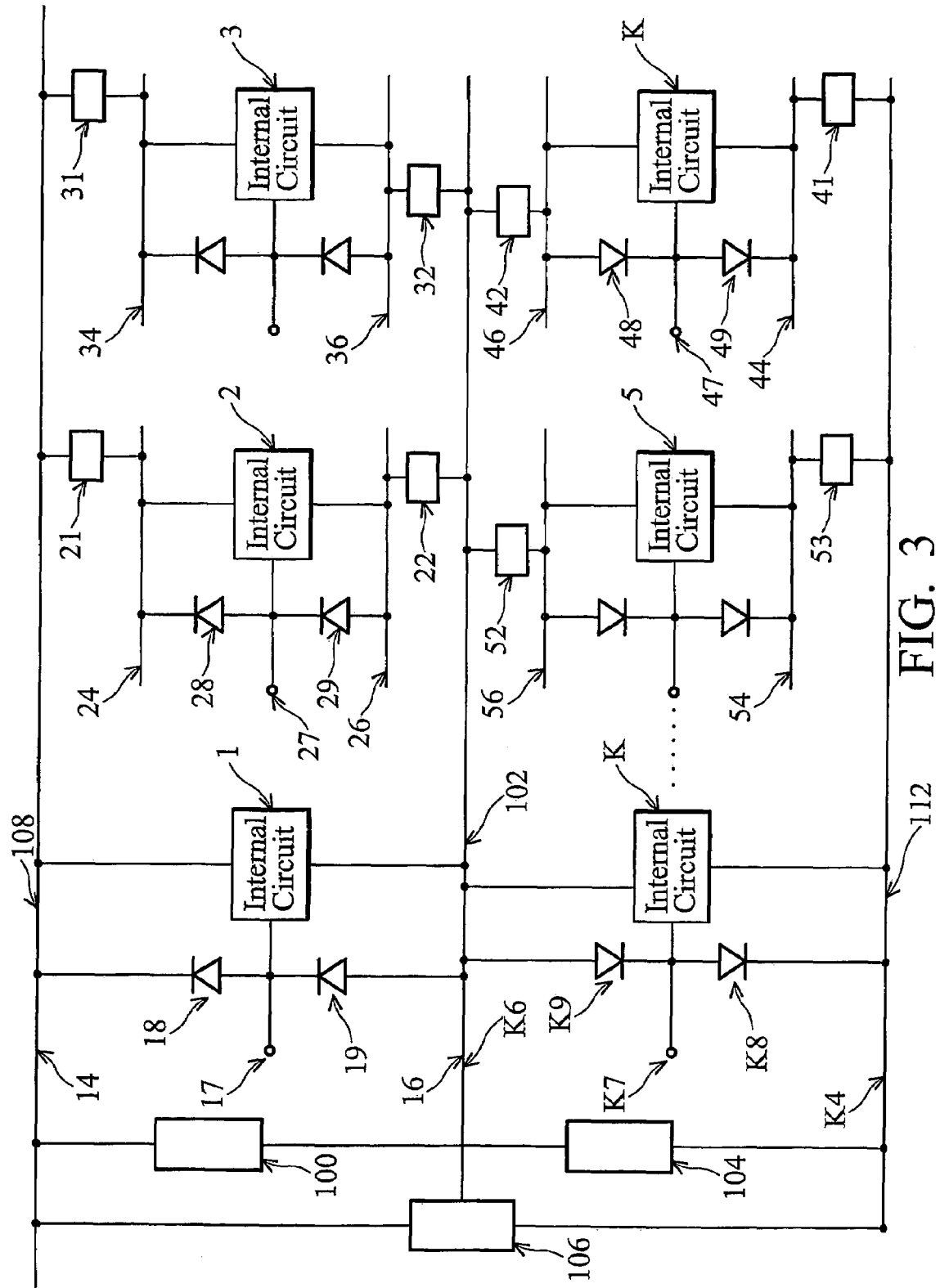
FIG. 3 illustrates the schematic diagram of the preferred embodiment.

FIG. 3 illustrates a schematic view of the preferred embodiment. There are k internal circuits belonging to two power domains. Throughout the detailed description, each internal circuit having its own power lines is considered to be in one power domain. Power domains may be grouped into main power domains. Internal circuits 1, 2 and 3 are in one main power domain with lower power supply voltages, so that their voltages are denoted as $VDD_L$ and $VSS_L$ where the letter L indicates "low". Internal circuit 1 is coupled between power lines 14 (at voltage $VDD_{L1}$) and 16 (at voltage $VSS_{L1}$), internal circuit 2 is coupled between power lines 24 (at voltage $VDD_{L2}$) and 26 (at voltage $VSS_{L2}$), and internal circuit 3 is coupled between power lines 34 (at voltage $VDD_{L3}$) and 36 (at voltage $VSSL_3$). These low power supply voltages are separated into different power domains for the purpose of decoupling noises. Internal circuit 4 through circuit k are in a main power domain with a higher voltage and their VDD power lines are denoted as 44 (at voltage $VDD_{H4}$) through k4 (also known as ESD bus 112, and its voltage is $VDD_{Hk}$). The VSS power lines of the circuits are 46 (at voltage $VSS_{H4}$) through k6 (also known as ESD bus 102).

Assume circuit 1 and its power lines 14 and 16 are selected as the ESD buses 108 and 102, respectively. An ESD clamp device 100 is added between ESD buses 108 and 102 to conduct ESD current between these two ESD buses. Power lines 24 and 34 are connected to ESD bus 108 through ESD connection cells 21 and 31, respectively. Power lines 26 and 36 are also connected to ESD bus 102 through the ESD connection cells 22 and 32, respectively. The internal circuits 4 through k are coupled between high voltage power lines 44, 54, . . . , k4 and 46, 56, . . . , k6 respectively. Circuit k is selected so that its VDD power line k4 is used as ESD bus 112. The VDD power lines 44, 54, . . . , (k−1)4 are coupled to ESD bus 112 through ESD connection cells 41, 51, . . . , (k−1)1. The VSS power lines 46, 56, . . . , (k−1)6 are coupled to ESD bus 102 through ESD connection cells 42, 52, . . . , (k−1)2. The VSS power line k6 of internal circuit k is combined with ESD bus 102 since they are at the same voltage level. An ESD clamp 106 is coupled between ESD buses 108 and 112, and another ESD clamp device 104 is coupled between ESD buses 102 and 112. ESD clamp devices 100, 104 and 106 are designed to provide a high conductivity path to quickly bypass the transient current away from the internal circuits of the IC with multiple power lines. ESD clamp devices may be made of diodes or silicon-controlled rectifiers. The details of the ESD clamp devices and ESD connection cells may be found in U.S. Pat. No. 6,144,542, which patent is incorporated herein by reference.

When the IC is under normal operation, all ESD connection cells and ESD clamp devices are in the off state, that is, no current conducts through them. So circuits 1 through circuit k are decoupled. If an electrostatic transient occurs, for example, causing a positive ESD voltage to the input pad 17 of circuit 1, and assuming the input pad k7 of circuit k is relatively grounded, the ESD current is conducted into the ESD bus 108 through diode 18 in circuit 1, and then the ESD current is conducted to ESD bus 102 through the ESD clamp device 100. Finally, the ESD current is discharged through diode k9 in the ESD protection circuit k to the grounded pad k7. Therefore, the ESD current passes through one ESD clamp 100 and none of the ESD connection cells.

Now assume the electrostatic charges causes a positive ESD voltage to input pad 27 of circuit 2, and further assume that the input pad k7 of circuit k is relatively grounded. The ESD current is first conducted into the power line 24 through diode 28, then to the ESD bus 108 through the ESD connection cell 21. The ESD current then goes through the ESD clamp device 100 to the ESD bus 102, and finally to the grounded pad k7 of circuit k through the diode k9. In this case, the ESD current passes through one ESD clamp 100 and one ESD connection cell 21.

Figure 1:
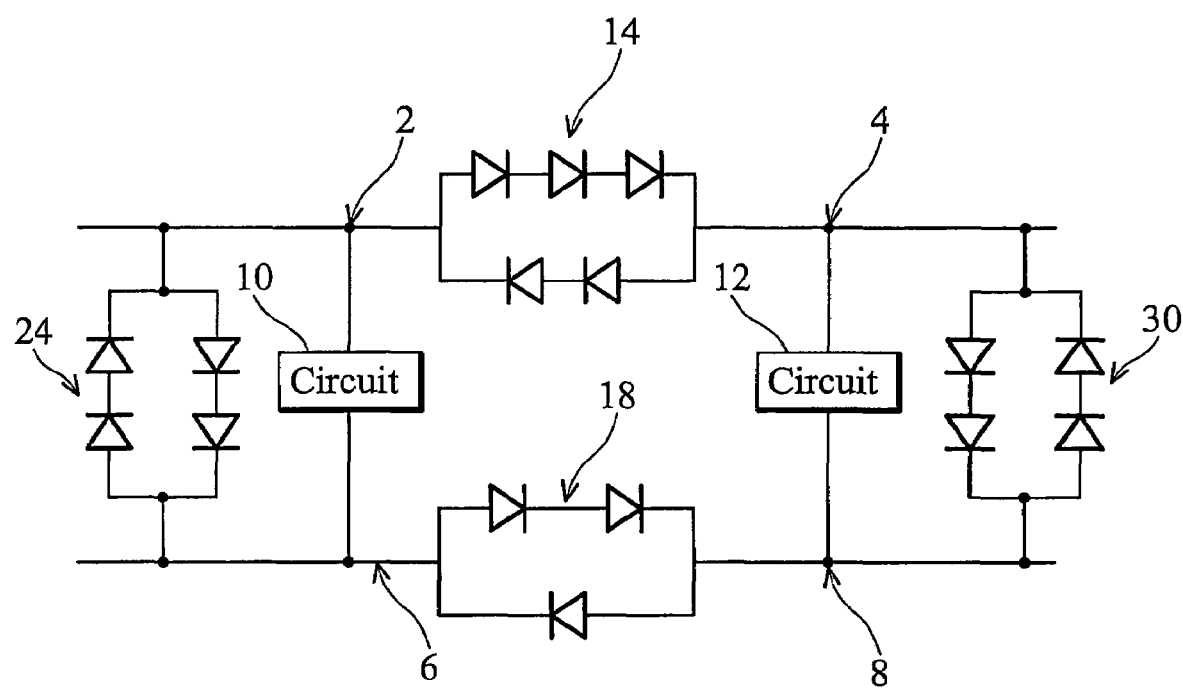
FIG. 1 illustrates a conventional multi-domain ESD protection circuit without using ESD buses.
Figure 2:
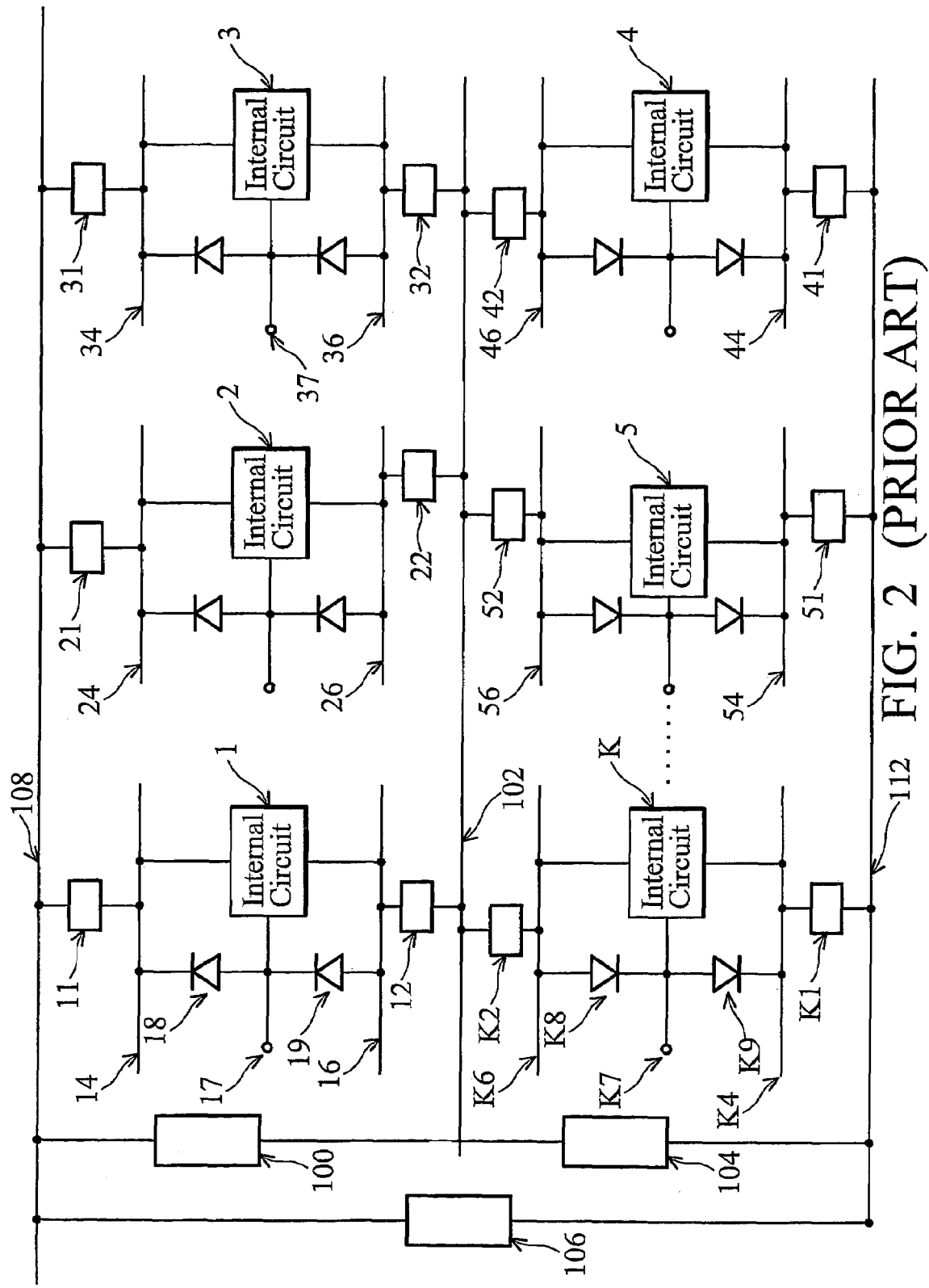
FIG. 2 illustrates a prior art multi-domain ESD protection circuit using ESD buses.

It is observed that in the first case wherein the transient occurs in internal circuit 1, the ESD current passes through one ESD clamp and no ESD connection cells. In the second case wherein the transient occurs in circuit 2, the ESD current passes through one ESD clamp and one ESD connection cell. Compared to the prior art in FIG. 2, the ESD passes at least one less ESD connection cell. Due to the short duration (typically in nanoseconds order) of the ESD transient, the ESD protection devices must act fast to discharge, otherwise the transient would cause damage to the IC circuit. It is desired that the ESD current passes as few ESD protection devices as possible before it is discharged. Therefore, the preferred embodiment of the present invention has better performance over the prior art.

Several factors are taken into consideration in order to select which of the power lines are to be used as the ESD buses. Firstly, it is desirable that the ESD bus is selected from the power lines whose circuit has better grounding. The reason can be explained as such. Considering a case wherein the electrostatic charge causes a positive ESD voltage to input pad 27 of circuit 2, the input pad 47 of circuit 4 is relatively grounded and the power lines of circuit k are ESD buses, as shown in FIG. 3. Before the ESD current is discharged to the ground through input pad 47 of circuit 4, it goes through 1 ESD clamp 100 and two ESD connection cells 21 and 42. The performance in this case is the same as the circuit in prior art 2. If the selected circuit k has a good grounding, an ESD current from the circuit can be conducted into circuit k directly from ESD bus 102 without going through an ESD connection cell. Secondly, since the ESD bus passes through a power line which was designed to carry operation current as well, the selected power lines need to be wider than the normal power lines otherwise the heating effect can damage the IC circuit. It is desirable that the ESD bus is about 50 to about 75 percent wider, and more preferably about 75 percent wider than the normal power lines. It is more desirable that if one of the power lines is wider so that it can carry extra current, it can simply be selected as the ESD bus. In addition, it is desired that the ESD bus be made with a highly conductive material such as copper.

Thirdly, the layout of the power lines should be considered. The selection of a power line as the ESD bus should not cause difficulty to the circuit layout, and a power line is preferably selected if no extra layers are needed in order to connect it to other power lines through ESD connection cells and ESD clamp devices.

Figure 4:
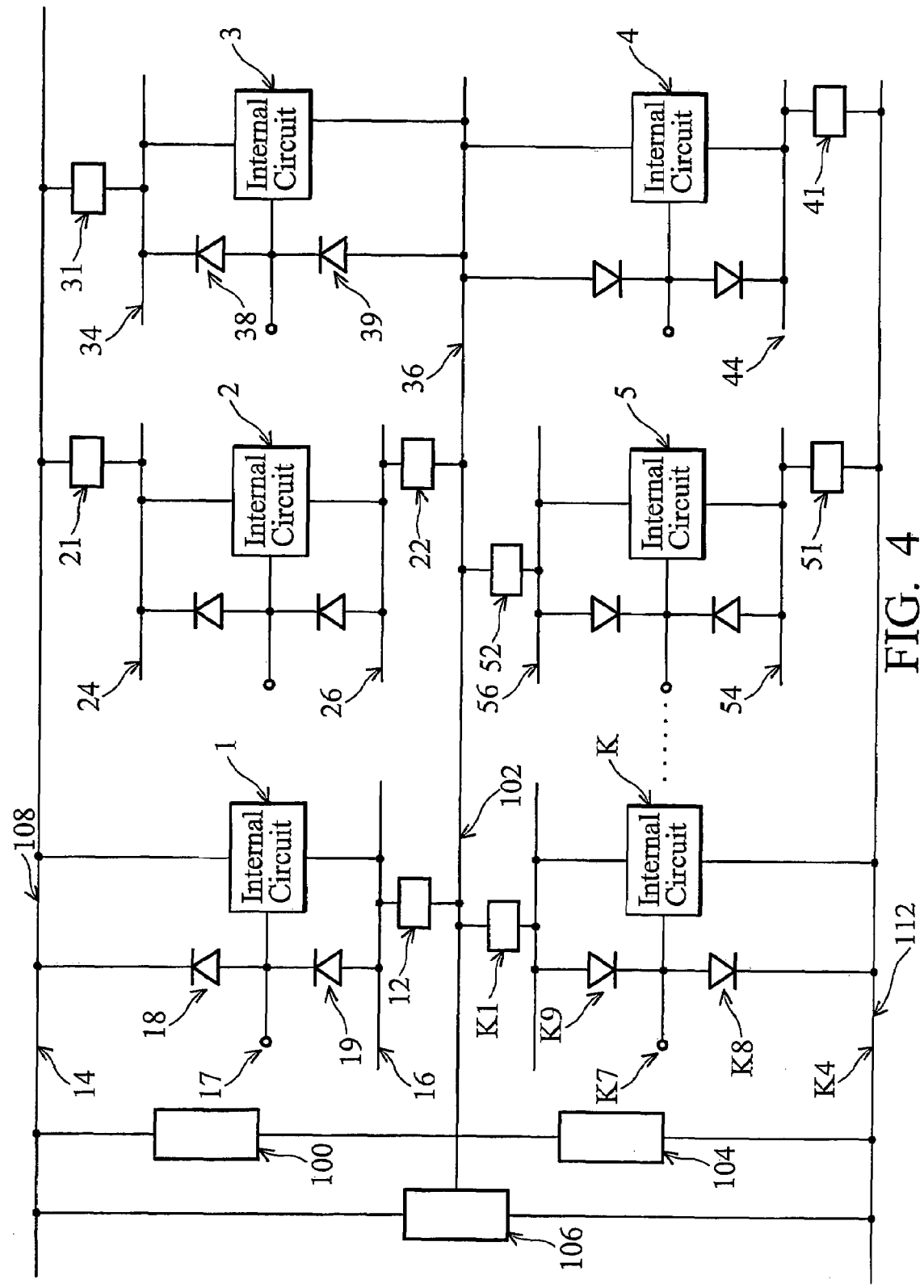
FIGS. 4 through 6 illustrate the schematic diagrams of the variations of the preferred embodiment.

The preferred embodiment can also be shown in another variation. As shown in FIG. 4, the VDD power line of internal circuit 108 is used as the ESD bus, however, the corresponding VSS power line is not. Another VSS power line 36 of internal circuit 3 is deemed better as the ESD bus, so it is selected as the ESD bus 102. Similarly, VDD power line k4 of circuit k is selected as ESD bus 112 and another VSS power line 42 is combined into ground ESD bus 102. The performance of this variation is the same as the preferred embodiment as shown in FIG. 3. This embodiment provides more options for circuit designers. By separately selecting an ESD bus for VDD power lines and VSS power lines, the circuit design becomes more flexible, and the advantage of the present invention can be fully taken.

Figure 5:
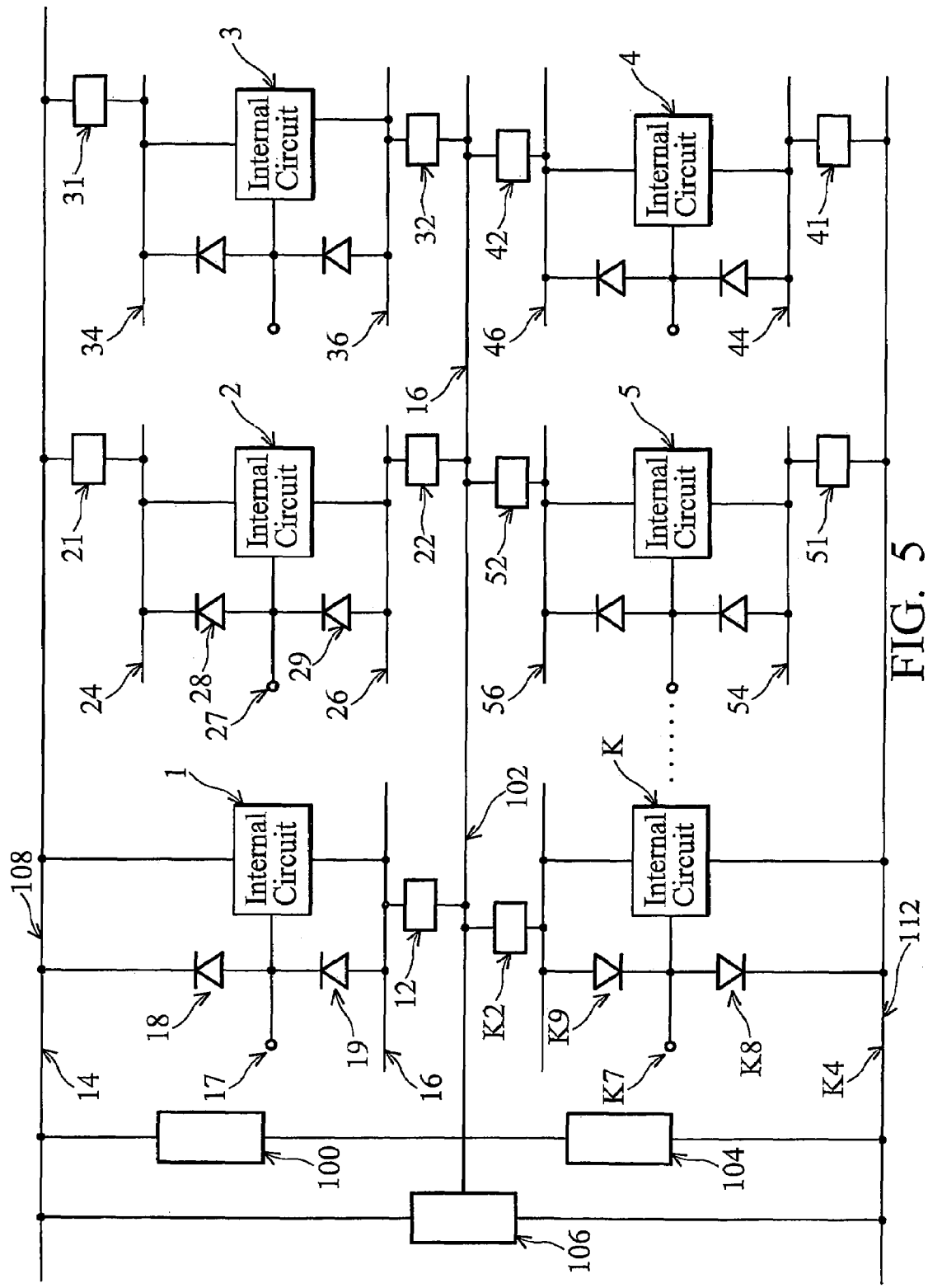

It is desirable that both a VDD power line and a VSS power line be selected as ESD buses so that the performance improvement of the present invention is maximized. However, a situation may occur wherein only one of the power lines can be used. FIG. 5 illustrates one of the variations of the preferred embodiment. The power line 14 of the internal circuit 1 is used as the ESD bus 108 for power lines 24 and 34. Power line k4 of the internal circuit k is used as the ESD bus 112 for power lines 41, 51, . . . (k−1)1. Whereas an additional ESD-Bus-2 is added as the common ESD bus for all VSS power lines of the internal circuits since no VSS power line is a good ESD bus candidate.

The performance of this embodiment is between the preferred embodiment and the prior art and depends on where the transient occurs and discharges. For example, if the electrostatic charge causes a positive ESD voltage to input pad 17 of circuit 1, and the input pad k7 of circuit k is relatively grounded, then the ESD current goes through one ESD clamp device 100 and one ESD connection cell k2, so that the performance is inferior to the preferred embodiment but still better than the prior art shown in FIG. 2. If the electrostatic charges cause a positive ESD voltage to input pad 27 of circuit 2, then ESD current goes through one ESD clamp 100 and two ESD connection cells 21 and k2, and the performance is the same as the prior art in FIG. 2.

It is to be noted that devices 18, 28, 38 . . . k8 and 19, 29, . . . k9 are one-directional diodes. If an alternative circuit design is used so that these diodes are replaced by bi-directional protection devices, the ESD current at input pad 27 of circuit 2 can be conducted to ESD bus 108 through ESD connection cell 21 to ESD bus 112 through the ESD clamp device 106, then to the grounded input pad k7 of circuit k through bi-directional device k8. In this case, this embodiment still has better performance than the prior art since it does not go through any ESD connection cells, while in the prior art, ESD current needs to go through two ESD connection cells.

Figure 6:
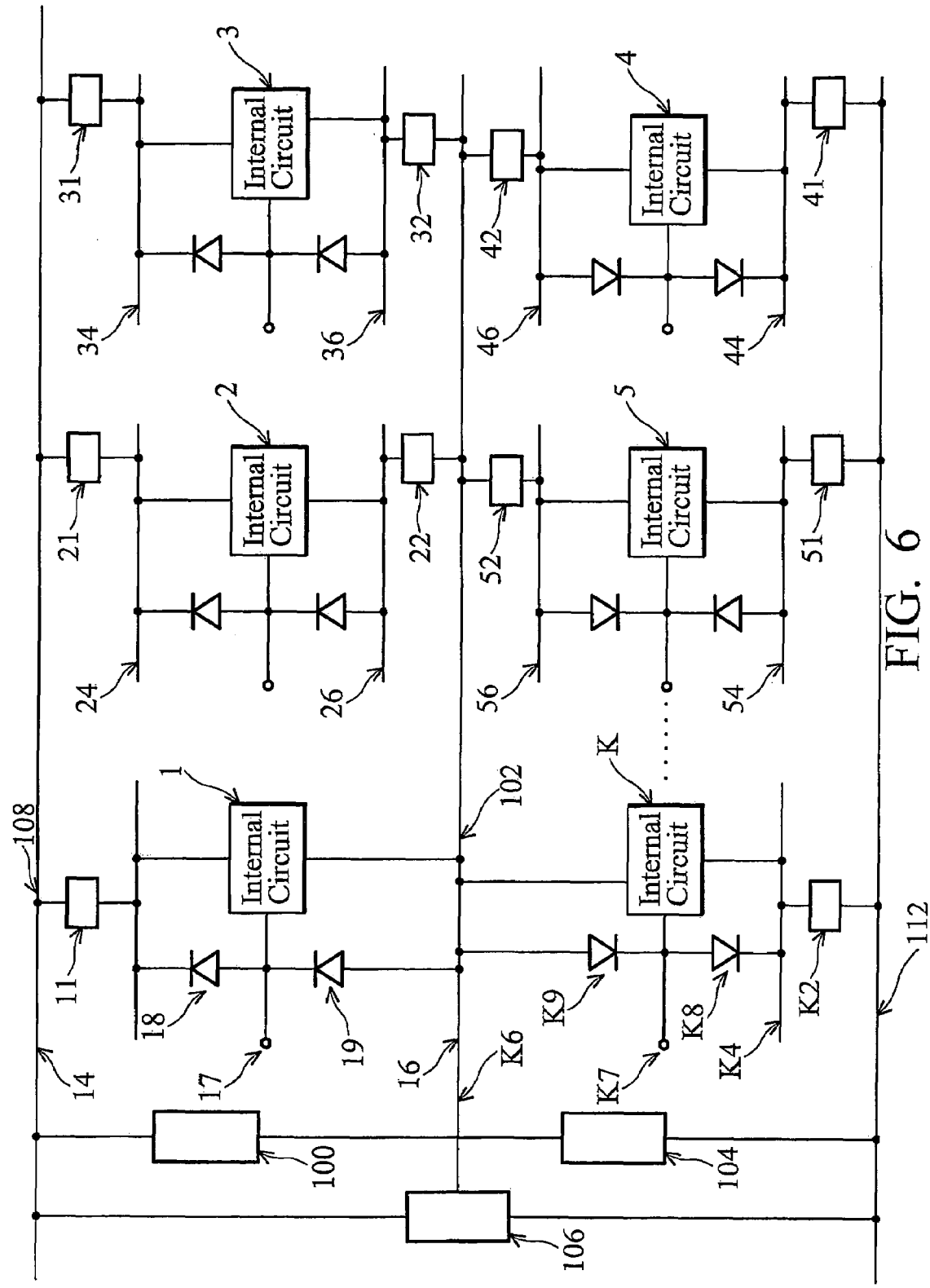

If there is no VDD power line suitable for an ESD bus while one of the VSS power lines is a good candidate, another embodiment as shown in FIG. 6 can be used. VSS power line 16 of the internal circuit 1 is shared by all internal circuits 1 through k as the ESD bus 102. Whereas an ESD bus 108 is added as the common ESD bus for power lines 11, 21 and 31, and an additional ESD bus 112 is added as the common ESD bus for VDD power lines 41, 51, . . . , k1. The performance of this embodiment is similar to the embodiment shown in FIG. 5. However, two additional buses are used so more layout areas are required.

Figure 7:
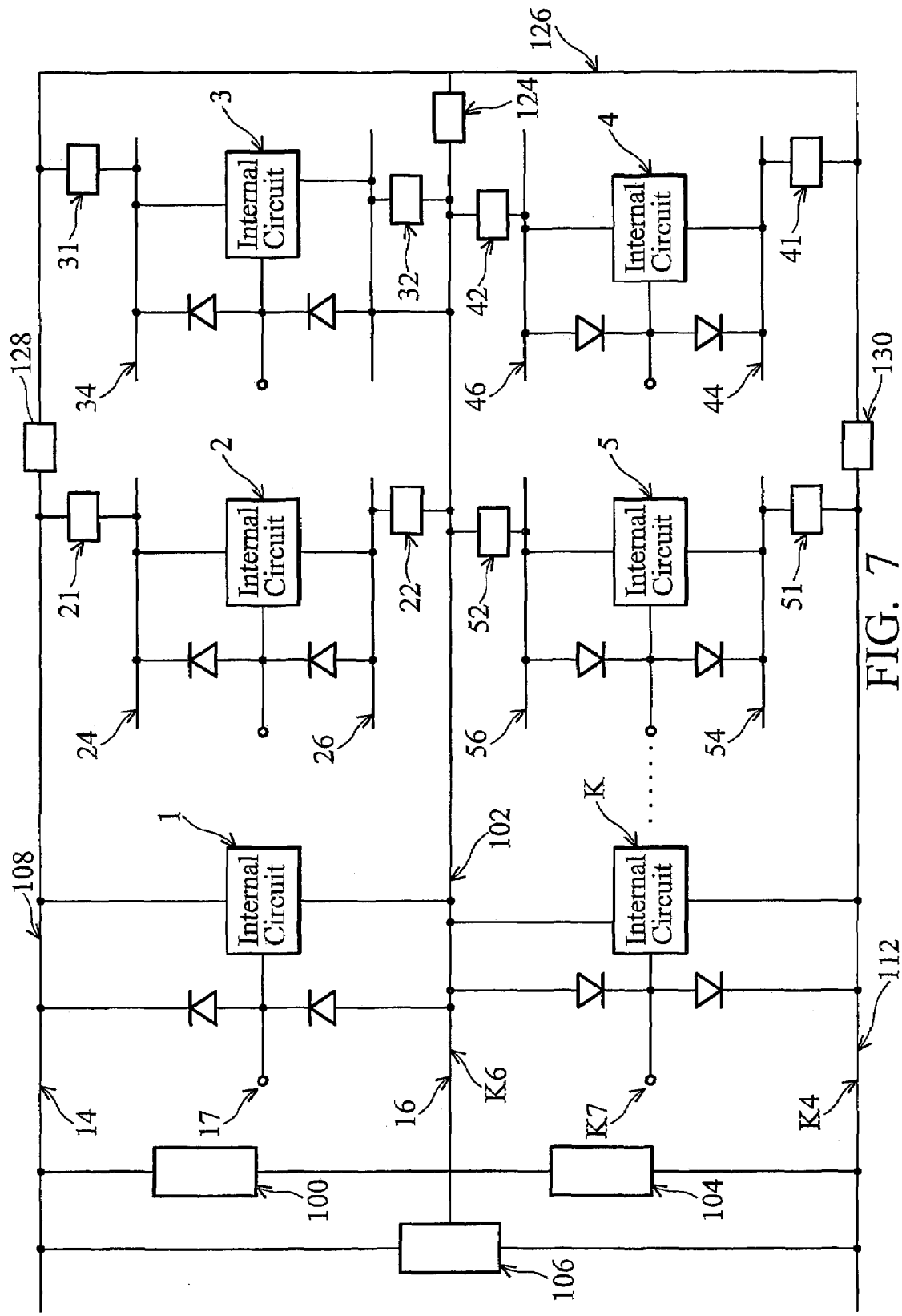
FIG. 7 illustrates an application of the present invention in a multiple main power domains circuit.

FIG. 7 illustrates an application of the present invention. The circuits in a chip may be divided into different main power domains. The main power domains are defined either to decouple noise, to separate the analog and digital circuit, or to separate different power voltages. The present invention can be built into a power domain hierarchy having the structure of main power domains, and power domains. Between the main power domains, ESD clamp devices are used to protect the transients that occur between main power domains. Within one main power domain, the present invention is used.

As shown in FIG. 7, the circuit is separated into three main power domains due to the three power voltages used, for example, 2.5V, 3V and 5V. Circuit 1 and circuit 2 use 2.5V power supplies, so they share VDD power line 14 (also denoted as ESD bus 108) of internal circuit 1, and VSS power line 16 (also denoted as ESD bus 102) of internal circuit 1 as common ESD buses. Circuit 5 through circuit k use 5V power supplies, so they share VDD power line k4 (ESD bus 112) of circuit k as ESD bus. The values of 2.5V, 3V and 5V are provided as example only. Other values could be used. The VSS power line k6 of circuit k is combined with ESD bus 102 since they are at the same voltage level. Circuit 3 and circuit 4 use 3V power supplies, so they share an added ESD bus 126 through ESD connection cells 31 and 41, and also share ESD bus 102 through ESD connection cells 32 and 42. Between the main power domains, ESD clamp devices 100, 104, 106, 124, 128 and 130 are coupled between every two ESD buses. This hierarchical structure ensures while the main power domains are fully separated, the advantages of the present invention can also be utilized.

The embodiments of the present invention have several advantages. First, it saves the layout area. An ESD bus has similar width as the power lines, typically about 20 µm. The area saved is 20 µm times the length of the ESD bus. When more than one power domain exists, the area saved may be significant. Second, the performance is improved compared to the prior art since fewer protection circuits are passed before an ESD current is conducted to the ground. Also, since added ESD buses may need extra layers, fewer ESD buses means fewer layers are required.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electrostatic discharge (ESD) protection circuit structure comprising:
   a plurality of first power lines;
   a plurality of second power lines;
   an ESD bus;
   a plurality of first internal circuits, each coupled between one of the first power lines and one of the second power lines;
   a third power line;
   a fourth power line;
   a second internal circuit connected to the third power line and coupled to the fourth power line;
   a plurality of first ESD bi-directional connection cells, each connected between one of the first power lines and the third power line;
   a plurality of second ESD bi-directional connection cells, each coupled between one of the second power lines and the ESD bus;
   an ESD bi-directional connection cell coupled between the fourth power line and the ESD bus; and
   an ESD clamp coupled between the third power line and the ESD bus.

2. The ESD protection circuit structure of claim 1 wherein the plurality of first power lines are VDD power lines, the plurality of second power lines are VSS power lines, the third power line is a VDD power line, and the fourth power line is a VSS power line.

3. The ESD protection circuit structure of claim 1 wherein the plurality of first power lines are VSS lines, the plurality of second power lines are VDD lines, the third power line is a VSS line, and the fourth line is a VDD line.

4. The ESD protection circuit structure of claim 1 wherein the ESD bus is a metal line.

5. The ESD protection circuit structure of claim 1 wherein the ESD bus is a copper line.

6. The ESD protection circuit structure of claim 1 wherein the ESD bus and the third power line are wider than the plurality of first power lines and the plurality of second power lines.

7. The ESD protection circuit structure of claim 1 wherein the plurality of the first ESD bi-directional connection cells are directly connected between one of the first power lines and the third power line, and wherein the second internal circuit is directly connected to the third power line.

8. An ESD protection circuit structure comprising:
   a plurality of first power lines;
   a plurality of second power lines;
   a plurality of first internal circuits, each coupled between one of the plurality of first power lines and one of the plurality of second power lines;
   a third power line;
   a fourth power line;
   a second internal circuit connected to the third power line and coupled to the fourth power line;
   a fifth power line;
   a sixth power line;
   a third internal circuit coupled to the fifth power line and connected to the sixth power line;
   a plurality of first ESD bi-directional connection cells, each coupled between one of the plurality of first power lines and the third power line;
   a plurality of second ESD bi-directional connection cells, each coupled between one of the plurality of second power lines and the sixth power line;
   a third ESD bi-directional connection cell coupled between the fourth power line and the sixth power line; and
   a fourth ESD bi-directional connection cell coupled between the third power line and the fifth power line.

9. The ESD protection circuit structure of claim 8 wherein the third power line and the sixth power line are metal lines.

10. The ESD protection circuit structure of claim 8 wherein the third power line and the sixth power line are copper lines.

11. The ESD protection circuit structure of claim 8 wherein the third power line and the sixth power line are wider than the first power lines, the second power lines, the fourth power line and the fifth power line.

12. The ESD protection circuit structure of claim 8 wherein:
   the second internal circuit is directly connected to the third power line;
   the third internal circuit is directly connected to the sixth power line;
   each of the first ESD bi-directional connection cells is directly connected to one of the first power lines and the third power line; and
   each of the second ESD bi-directional connection cells is directly connected to one of the second power lines and the sixth power line.

13. An ESD protection circuit structure comprising:
   a first ESD bus and a second ESD bus;
   a plurality of first compound ESD devices, each of the first compound ESD devices having a power line coupled to an ESD connection cell;
   a plurality of second compound ESD devices, each of the second compound ESD devices having a power line coupled to an ESD connection cell;
   a plurality of first internal circuits, each coupled with the first ESD bus through one of the first compound ESD devices, wherein the ESD connection cell of the first compound ESD device is coupled with the first ESD bus and wherein the power line of the first compound ESD device is coupled with the first internal circuit;
   a plurality of second internal circuits, each coupled with the second ESD bus through one of the second compound ESD devices wherein the ESD connection cell of the second compound ESD device is coupled with the second ESD bus and the power line of the second compound ESD device is coupled with the second internal circuit;
   a third internal circuit having a first end connected to the first ESD bus; and
   an ESD clamp coupled between the first ESD bus and the second ESD bus.

14. The ESD protection circuit structure of claim 13 wherein:
   the first end of the third internal circuit is directly connected to the first ESD bus;
   each of the first internal circuits is directly connected to the first ESD bus through one of the first compound ESD devices, wherein the ESD connection cell of the first compound ESD device is directly connected to the first ESD bus and wherein the power line of the first compound ESD device is directly connected to the first internal circuit; and
   each of the second internal circuits is directly connected to the second ESD bus through one of the second compound ESD devices wherein the ESD connection cell of the second compound ESD device is directly connected to the second ESD bus and the power line of the second compound ESD device is directly connected to the second internal circuit.

15. The ESD protection circuit structure of claim 13 wherein the first ESD bus and the second ESD bus are wider than the power lines of the first compound ESD devices and the power lines of the second compound ESD devices.

16. The ESD protection circuit structure of claim 13 wherein:
the first ESD bus is a VDD power line;
the power line of the first compound ESD device is a VDD power line;
the second ESD bus is a VSS power line; and
the power line of the second compound ESD device is a VSS power line.

17. The ESD protection circuit structure of claim 13 wherein:
the first ESD bus is a VSS power line;
the power line of the first compound ESD device is a VSS power line;
the second ESD bus is a VDD power line; and
the power line of the second compound ESD device is a VDD power line.

18. The ESD protection circuit structure of claim 13 wherein:
the third internal circuit having a second end connected to the second ESD bus.

19. The ESD protection circuit structure of claim 18 wherein:
the first end of the third internal circuit is directly connected to the first ESD bus;
the second end of the third internal circuit is directly connected to the second ESD bus;
each of the plurality of the first internal circuits is directly connected to the first ESD bus through one of the first compound ESD devices, wherein the ESD connection cell of the first compound ESD device is directly connected to the first ESD bus and wherein the power line of the first compound ESD device is directly connected to the first internal circuit; and
each of the plurality of the second internal circuits is directly connected to the second ESD bus through one of the second compound ESD devices wherein the ESD connection cell of the second compound ESD device is directly connected to the second ESD bus and the power line of the second compound ESD device is directly connected to the second internal circuit.

20. The ESD protection circuit structure of claim 13 wherein:
the third internal circuit has a second end coupled with the second ESD bus through one of the second compound ESD devices with the power line of the second compound ESD device coupled with the third internal circuit.

21. The ESD protection circuit structure of claim 20 further comprising:
a fourth internal circuit having a first end coupled with the first ESD bus through one of the first compound ESD devices wherein the power line of the first compound ESD device is coupled with the fourth internal circuit; and
the fourth internal circuit having a second end connected to the second ESD bus.

22. The ESD protection circuit structure of claim 21 wherein:
the first end of the third internal circuit is directly connected to the first ESD bus;
the second end of the third internal circuit is directly connected to the second ESD bus through one of the second compound ESD devices with the power line of the second compound ESD device directly connected to the third internal circuit;
the first end of the fourth internal circuit is directly connected to the first ESD bus through one of the first compound ESD devices wherein the power line of the first compound ESD device is directly connected to the fourth internal circuit;
the second end of the fourth internal circuit is directly connected to the second ESD bus;
each of the first internal circuits is directly connected to the first ESD bus through one of the first compound ESD devices, wherein the ESD connection cell of the first compound ESD device is directly connected to the first ESD bus and wherein the power line of the first compound ESD device is directly connected to the first internal circuit; and
each of the second internal circuits is directly connected to the second ESD bus through one of the second compound ESD devices wherein the ESD connection cell of the second compound ESD device is directly connected to the second ESD bus and the power line of the second compound ESD device is directly connected to the second internal circuit.

23. A whole chip ESD protection circuit structure comprising:
a plurality of ESD protection circuit structures wherein each ESD protection circuit structure comprises a first ESD bus, a second ESD bus, a plurality of first compound ESD devices, a plurality of second compound ESD devices, a plurality of first internal circuits, a plurality of second internal circuits, a third internal circuit and an ESD clamp, wherein;
each of the plurality of first compound ESD devices has a power line coupled to an ESD connection cell;
each of the plurality of second compound ESD devices has a power line coupled to an ESD connection cell;
each of the first internal circuits is coupled with the first ESD bus through one of the first compound ESD devices wherein the ESD connection cell of the first compound ESD device is coupled with the first ESD bus and the power line of the first compound ESD device is coupled with the first internal circuit;
each of the second internal circuits is coupled with the second ESD bus though one of the second compound ESD devices and wherein the ESD connection cell of the second compound ESD device is coupled with the second ESD bus and wherein the power line of the second compound ESD device is coupled with the second internal circuit;
the third internal circuit has a first end connected to the first ESD bus;
the ESD clamp is coupled between the first ESD bus and the second ESD bus; and
a plurality of ESD clamp devices, wherein the first ESD bus and the second ESD bus of the plurality of ESD protection circuit structures are coupled by the plurality of ESD clamp devices.

24. The whole chip ESD protection circuit structure of claim 23 wherein:
the first ESD bus is a VDD power line and the power line of the first compound ESD device is a VDD power line; and
the second ESD bus is a VSS power line and the power line of the second compound ESD device is a VSS power line.

25. The whole chip ESD protection circuit structure of claim 24 wherein the first ESD bus and the second ESD bus are wider than the power line of the first compound ESD device and the power line of the second compound ESD device.

26. The whole chip ESD protection circuit structure of claim 23 wherein:

the first end of the third internal circuit is directly connected to the first ESD bus;

each of the first internal circuits is directly connected to the first ESD bus through one of the first compound ESD devices, wherein the ESD connection cell of the first compound ESD device is directly connected to the first ESD bus and wherein the power line of the first compound ESD device is directly connected to the third internal circuit; and each of the second internal circuits is directly connected to the second ESD bus through one of the second compound ESD devices wherein the ESD connection cell of the second compound ESD device is directly connected to the second ESD bus and the power line of the second compound ESD device is directly connected to the second internal circuit.

* * * * *

UNITED STATES PATENT AND TRADEMARK OFFICE
CERTIFICATE OF CORRECTION

PATENT NO. : 7,411,767 B2  Page 1 of 1
APPLICATION NO. : 10/859332
DATED : August 12, 2008
INVENTOR(S) : Huang et al.

It is certified that error appears in the above-identified patent and that said Letters Patent is hereby corrected as shown below:

In Col. 10, line 67, delete "24" and insert --23--.

Signed and Sealed this

Eleventh Day of November, 2008

JON W. DUDAS
*Director of the United States Patent and Trademark Office*